United States Patent
Park et al.

(10) Patent No.: US 11,359,306 B2
(45) Date of Patent: Jun. 14, 2022

(54) METHOD FOR PREPARING A SIC INGOT AND DEVICE FOR PREPARING A SIC INGOT WHEREIN ELECTRICAL RESISTANCE OF CRUCIBLE BODY IS 2.9 OHMS OR MORE

(71) Applicant: SENIC INC., Cheonan-si (KR)

(72) Inventors: Jong Hwi Park, Suwon-si (KR); Myung-Ok Kyun, Suwon-si (KR); Jongmin Shim, Hwaseong-si (KR); Eun Su Yang, Suwon-si (KR); Byung Kyu Jang, Suwon-si (KR); Jung Woo Choi, Suwon-si (KR); Sang Ki Ko, Suwon-si (KR); Kap-Ryeol Ku, Suwon-si (KR); Jung-Gyu Kim, Suwon-si (KR)

(73) Assignee: SENIC INC., Cheonan-si (KR)

( * ) Notice: Subject to any disclaimer, the term of this patent is extended or adjusted under 35 U.S.C. 154(b) by 104 days.

(21) Appl. No.: 16/881,491

(22) Filed: May 22, 2020

(65) Prior Publication Data
US 2021/0123157 A1 Apr. 29, 2021

(30) Foreign Application Priority Data
Oct. 29, 2019 (KR) .......................... 10-2019-0135382

(51) Int. Cl.
*C30B 23/06* (2006.01)
*C30B 23/02* (2006.01)
(Continued)

(52) U.S. Cl.
CPC ........ *C30B 23/025* (2013.01); *C23C 14/0635* (2013.01); *C23C 14/243* (2013.01);
(Continued)

(58) Field of Classification Search
CPC ..... C30B 23/00; C30B 23/002; C30B 23/025; C30B 23/06; C30B 23/063; C30B 23/066;
(Continued)

(56) References Cited

U.S. PATENT DOCUMENTS

| 2001/0004875 A1* | 6/2001 | Kuhn ..................... C30B 29/36 117/11 |
| 2003/0054660 A1* | 3/2003 | Kuriyama ............... C30B 23/00 438/758 |

(Continued)

FOREIGN PATENT DOCUMENTS

| CN | 1282770 C | 11/2006 |
| JP | 11-268989 A | 10/1999 |

(Continued)

OTHER PUBLICATIONS

Materials information on graphite crucibles from Almath Crucibles, Ltd. accessed at https://almathcrucibles.com/materials/graphite on Oct. 28, 2021. (Year: 2021).*

*Primary Examiner* — Kenneth A Bratland, Jr.
(74) *Attorney, Agent, or Firm* — NSIP Law

(57) ABSTRACT

A method for preparing a SiC ingot includes preparing a crucible assembly comprising a crucible body having an internal space, loading a raw material into the internal space of the crucible body and placing a plurality of SiC seed in the internal space of the crucible body at regular intervals spaced apart from the raw material, and growing the SiC ingot from the plurality of SiC seed by adjusting the internal space of the crucible body to a crystal growth atmosphere such that the raw material is vapor-transported and deposited to the plurality of SiC seed. A density of the crucible body may be 1.70 to 1.92 g/cm³.

3 Claims, 3 Drawing Sheets

(51) Int. Cl.
  *C23C 14/06* (2006.01)
  *C23C 14/24* (2006.01)
  *C23C 14/50* (2006.01)
  *C23C 14/58* (2006.01)
  *C30B 29/36* (2006.01)
  *C30B 35/00* (2006.01)

(52) U.S. Cl.
  CPC ............ *C23C 14/50* (2013.01); *C23C 14/588* (2013.01); *C30B 29/36* (2013.01); *C30B 35/002* (2013.01)

(58) Field of Classification Search
  CPC ......... C30B 29/00; C30B 29/10; C30B 29/36; C30B 35/00; C30B 35/002; C23C 14/0635; C23C 14/243; C23C 14/50; C23C 14/588
  USPC ...... 117/84–85, 88, 101, 200–201, 204, 937, 117/951
  See application file for complete search history.

(56) References Cited

U.S. PATENT DOCUMENTS

| | | | | |
|---|---|---|---|---|
| 2012/0285370 | A1* | 11/2012 | Gupta | ................... C01B 32/956 117/84 |
| 2013/0280466 | A1 | 10/2013 | Zwieback et al. | |
| 2017/0342593 | A1* | 11/2017 | Sato | ..................... C01B 32/963 |

FOREIGN PATENT DOCUMENTS

| | | |
|---|---|---|
| JP | 2001-114599 A | 4/2001 |
| JP | 4178989 B2 | 11/2008 |
| JP | 2012-510951 A | 5/2012 |
| JP | 2012-136391 A | 7/2012 |
| JP | 2012-521948 A | 9/2012 |
| JP | 2013-82629 A | 5/2013 |
| JP | 2013-212952 A | 10/2013 |
| JP | 2014-114169 A | 6/2014 |
| JP | 5650869 B1 | 1/2015 |
| JP | 2015-59072 A | 3/2015 |
| JP | 2015-63435 A | 4/2015 |
| JP | 2015-117143 A | 6/2015 |
| JP | 5851227 B2 | 2/2016 |
| JP | 2016-56088 A | 4/2016 |
| JP | 2018-140884 A | 9/2018 |
| KR | 10-2006-0134764 A | 12/2006 |
| KR | 10-2007-0054719 A | 5/2007 |
| KR | 10-1003075 B1 | 12/2010 |
| KR | 10-2012-0024767 A | 3/2012 |
| KR | 10-2012-0030836 A | 3/2012 |
| KR | 10-2015-0066015 A | 6/2015 |
| WO | WO 2014/123036 A1 | 8/2014 |
| WO | WO 2017/057742 A1 | 4/2017 |

* cited by examiner

METHOD FOR PREPARING A SIC INGOT AND DEVICE FOR PREPARING A SIC INGOT WHEREIN ELECTRICAL RESISTANCE OF CRUCIBLE BODY IS 2.9 OHMS OR MORE

CROSS-REFERENCE TO RELATED APPLICATIONS

This application claims the benefit under 35 U.S.C. 119(a) of Korean Patent Application No. 10-2019-0135382 filed on Oct. 29, 2019, in the Korean Intellectual Property Office, the entire disclosure of which is incorporated herein by reference for all purposes.

BACKGROUND

1. Field

The present disclosure relates to a method for preparing a SiC ingot, method for preparing a SiC wafer, and a device for growing a SiC ingot.

2. Description of the Background

Single crystals of silicon carbide (SiC), silicon (Si), gallium nitride (GaN), sapphire ($Al_2O_3$), gallium arsenide (GaAs) and aluminum nitride (AlN) have characteristics that cannot be expected from their respective polycrystals, such that demands for their single crystals in the industrial field are increasing.

Single crystal SiC has a large energy band gap and its break field voltage and thermal conductivity are superior to silicon (Si). In addition, the carrier mobility of single crystal SiC is comparable to that of silicon, and the saturation drift rate and breakdown voltage of electrons are also large. Due to such characteristics, single crystal SiC is expected to be applied to semiconductor devices requiring high efficiency, high breakdown voltage and high capacity.

As methods for preparing a SiC single crystal, there are Liquid Phase Epitaxy (LPE), Chemical Vapor Deposition (CVD), Physical Vapor Transport (PVT), and the like. Among them, PVT is most widely used because it can produce ingot shaped SiC with a high growth rate, and is also called a seed sublimation method.

Japanese Patent Publication No. 2001-114599 discloses a method for growing a single crystal ingot on a seed crystal as follows: while heating by a heater in a vacuum vessel (heating furnace), into which argon gas can be introduced, a temperature of the seed crystal is maintained at a temperature of 10 to 100° C. lower than a temperature of the raw material powder such that the single crystal ingots grow on the seed crystal. In addition, there are attempts to produce single crystal ingots having large diameter without substantial defects.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method for preparing a SiC ingot includes: preparing a crucible assembly including a crucible body having an internal space; loading a raw material into the internal space of the crucible body and placing a plurality of SiC seed in the internal space of the crucible body at regular intervals spaced apart from the raw material; and growing the SiC ingot from the plurality of SiC seed by adjusting the internal space of the crucible body to a crystal growth atmosphere such that the raw material is vapor-transported and deposited to the plurality of SiC seed, wherein a density of the crucible body is 1.70 to 1.92 $g/cm^3$.

A height deviation of the SiC ingot between a center and an edge may be 0 to 10 mm.

An electrical resistance of the crucible body may be 2.9Ω or more.

In another general aspect, a method for preparing a SiC wafer includes: preparing a crucible assembly including a crucible body having an internal space; loading a raw material into the internal space of the crucible body and placing a plurality of SiC seed in the internal space of the crucible body at regular intervals spaced apart from the raw material; growing the SiC ingot from the plurality of SiC seed by adjusting the internal space of the crucible body to a crystal growth atmosphere such that the raw material is vapor-transported and deposited to the plurality of SiC seed; and forming the SiC wafer from the SiC ingot; wherein a density of the crucible body is 1.70 to 1.92 $g/cm^3$.

The forming the SiC wafer may include slicing the SiC ingot to prepare a sliced crystal having an off angle of 0 to 15 degrees; and grinding the sliced crystal to form the SiC wafer.

A diameter of the SiC wafer may be 4 inches or more.

A locking angle of the SiC wafer may be −1.0 to +1.0 degrees relative to a reference angle.

In another general aspect, a device for preparing a SiC ingot includes a reactor and heating means. A crucible assembly including a crucible body having an internal space is placed in the reactor, a raw material is loaded into the internal space of the crucible body and a plurality of SiC seed are placed in the internal space of the crucible body at regular intervals spaced apart from the raw material. The heating means increases a temperature of the internal space of the crucible body to a crystal growth atmosphere such that the raw material is vapor-transported and deposited to the SiC seed, and creates a crystal growth atmosphere to prepare the SiC ingot grown from the plurality of SiC seed. A density of the crucible body may be 1.70 to 1.92 $g/cm^3$.

The crucible body may be of a graphite.

A diameter of the crucible body may be 110 mm or more.

An electrical resistance of the crucible body may be 2.9Ω or more.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
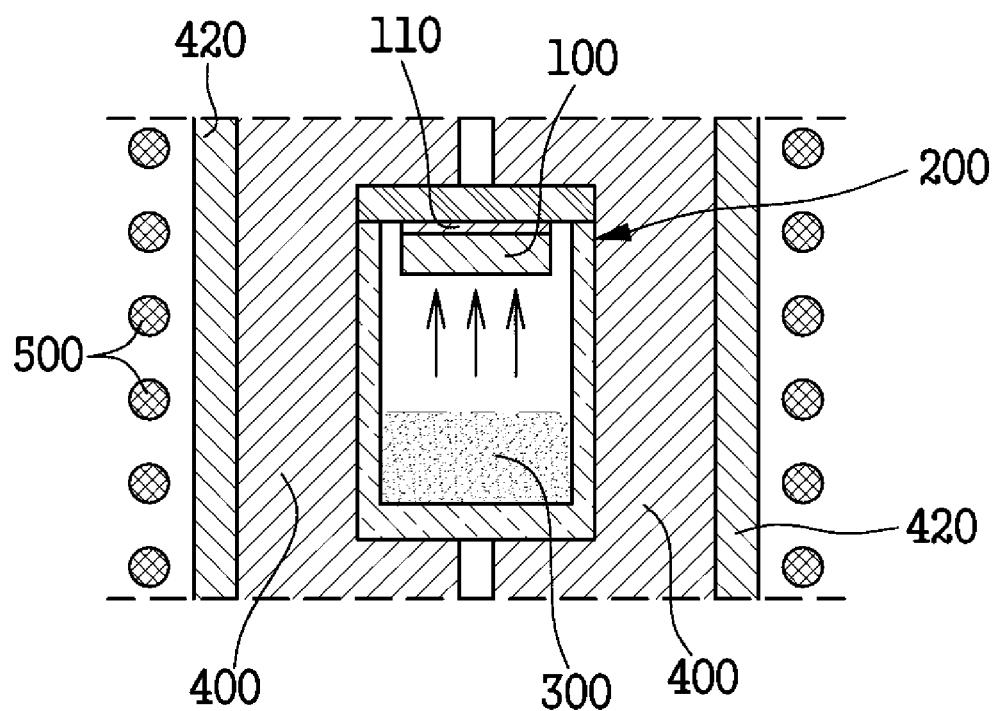
FIG. 1 is a conceptual view illustrating a cross section of a reaction chamber and the like according to one embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of features that are known in the art may be omitted for increased clarity and conciseness.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of this disclosure. Hereinafter, while embodiments of the present disclosure will be described in detail with reference to the accompanying drawings, it is noted that examples are not limited to the same.

Throughout the specification, the phrase that a certain element "comprises" or "includes" another element means that the certain element may further include one or more other elements but does not preclude the presence or addition of one or more other elements, unless stated to the contrary.

Throughout the specification, when a composition is "connected" to another composition, this includes not only 'directly connected' but also 'connected with another composition in the middle.'

As used herein, the term "and/or" includes any one and any combination of any two or more of the associated listed items; likewise, "at least one of" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

Throughout the specification, the term "combination of" included in Markush type description means mixture or combination of one or more elements described in Markush type and thereby means that the disclosure includes one or more elements selected from the Markush group.

Throughout the specification, a pit on a surface of a SiC ingot is evaluated by measuring a number of the pits per unit area (1 cm$^2$) at five spots by observing the five spots with an optical microscope, and then evaluating the average value. Wherein the five spots are as follows: one spot in a center of a surface of the SiC ingot except for facets, and four spots located at 3, 6, 9, and 12 o'clock, and positioned approximately 10 mm inward from an edge to the center of the SiC ingot.

Throughout the specification, an off angle of X degrees means that it has an off angle evaluated as X degrees from a reference plane within a general error range, and for example, it includes an off angle in a range from (X−0.05 degrees) to (X+0.05 degrees). In the case of 4H SiC, a (0001) plane may be applied as the reference plane.

Throughout the specification, the locking angle "1 to +1 degree" means −1 to +1 degree relative to a reference angle, even if not mentioned otherwise.

Throughout the specification, the locking angle "−1 to +1 degree relative to a reference angle" means that a value of a full width at half maximum (a FWHM value) is in the range from (peak angle-1 degree) to (peak angle+1 degree) with respect to the peak angle which is the reference angle.

An aspect of the present disclosure is to provide a SiC ingot with good quality, a method for preparing the same, a method for preparing a SiC wafer and a device for preparing a Sic ingot.

While investigating how to produce SiC ingots having larger area and less defects, the inventors confirmed that the characteristics of the crucible itself as well as the temperature control when growing SiC by physical vapor transport (PVT) influence on the quality and growth rate of the grown ingot. Therefore, it was confirmed that the SiC ingots having larger area and less defects can be produced by adjusting the characteristics of the crucible itself. It was confirmed that the density and the resistance of the crucible were the factors having a great influence on the atmosphere of ingot growth, and that the properties of ingot is changed by controlling these factors. For example, the resistance value is different for each crucible even if same type of crucible is used, and it was confirmed that this affects the properties and yield of the SiC ingot and wafer. Accordingly, the present disclosure provides a method of efficiently manufacturing an ingot with excellent properties by precisely controlling the density, resistance, and the like of the crucible.

The method for preparing the SiC ingot 100 according to one embodiment includes a preparation step, a raw material loading step and a growth step.

The preparation step is a step of preparing a crucible assembly 200 including a crucible body 210 having an internal space. The crucible assembly 200 may include the crucible body 210 and a crucible cover 220 covering the crucible body 210.

In the raw material loading step, the raw material 300 is loaded into the internal space of the crucible assembly 200 and a plurality of silicon carbide seed 110 are disposed in the internal space of the crucible assembly at regular intervals spaced apart from the raw material.

The crucible body 210 may be, for example, a cylindrical shape having an opening at an upper side, and may have a structure capable of loading a SiC raw material therein.

The crucible body 210 may have a density in the range of 1.70 to 1.92 g/cm$^3$. The crucible body 210 may include a graphite, or the crucible body may be made of a graphite.

The crucible body 210 may have an electrical resistance of 2.9Ω or more. If the crucible body has such electrical resistance, more efficient ingot growth process may be enabled.

The crucible body 210 may have an electrical resistance of 2.9 to 7.0Ω, or 2.9 to 4.1Ω. The crucible body may have an electrical resistance of 3.0 to 3.9Ω. By using a crucible body having an electrical resistance value in the above range, an ingot with better quality may be produced.

The electrical resistance is a value obtained by separately measuring the electrical resistance of the individual crucible body. The measurement can be performed by a direct heating test of the crucible body using an induced current. Alternatively, it may be predicted from a value indirectly measured using a separate measuring apparatus described below (having a correlation of coefficient of determination of 0.99 or more).

The electrical resistance of the crucible body is an important factor among several factors that affect a degree of temperature rise and a temperature distribution in a reactor during a reaction in heating methods such as induction heating. The inventors confirmed that there is a difference in resistance value for each of the crucible body, the difference is large even if each of the crucible body have same weight and are of same type, and the difference affects the quality or growth rate of the ingot manufactured.

Thus, the electrical resistance of the crucible body mentioned above means the electrical resistance of the individual crucible body.

The crucible body 210 has an internal space therein, the diameter of the internal space may be 110 mm or more, or 150 mm or more. The crucible body having such an internal space is more advantageous for production of large ingots, and together with the characteristics of the density and the electrical resistance mentioned above, it may produce a better quality ingot with excellent yield.

The crucible cover 220 may have a density in the range of 1.70 to 1.92 g/cm$^3$. The crucible cover 220 may include a graphite, or the crucible cover may be made of a graphite.

The crucible cover 220 may have an electrical resistance of 1 to 5Ω. By using a crucible cover having an electrical resistance value in the above range, it may produce an ingot with better quality. The electrical resistance of the crucible cover mentioned above is a value obtained by separately measuring the electrical resistance of the individual crucible cover. The measurement can be performed by a direct heating test of the crucible cover using an induced current. Alternatively, it may be predicted from a value indirectly measured using a separate measuring apparatus described below (having a correlation of coefficient of determination of 0.99 or more).

The crucible cover 220 may be configured to cover the entire opening of the crucible body 210. The crucible cover 220 may cover a part of the opening of the crucible body 210 or the crucible cover 220 including a through hole (not shown) may be applied. In such a case, the rate of vapor-transport can be controlled in the crystal growth atmosphere described later.

The SiC seed 110 may be disposed over the raw material 300, for example, by directly adhering to the crucible cover 220. In such a case, a separate seed holder 230 is not applied, and the crucible cover 220 may be integrated with the seed holder 230.

The seed holder 230 may be equipped separately from the crucible cover 220. Specifically, the seed holder 230 may be disposed between the crucible body 210 and the crucible cover 220 or at a predetermined location in a configuration such as a fixing groove located at a position close to the opening of the crucible body 210 to support the SiC seed 110.

The crucible assembly 200 is assembled by combining the crucible body 210 and the crucible cover 220, and it is assembled after placing the seed holder 230 at the crucible body 210, at the crucible cover 220, or between the crucible body 210 and the crucible cover 220, if necessary.

The raw material 300 includes a carbon source and a silicon source. Specifically, the raw material 300 may include a carbon-silicon source or may further include a carbon source and/or a silicon source. The carbon source may be a resin (ex: phenol resin) comprising large amount of carbon and the like, and silicon particles may be used as the silicon source, but are not limited thereto. More specifically, SiC particles may be used as the raw material.

The raw material having a particle size of 75 um or less may be included in an amount of 15 wt % or less, 10 wt % or less, or 5 wt % or less, based on the total weight of the raw material. When a raw material having a relatively small amount of a small particle size is applied, it is possible to manufacture a SiC ingot having reducing defects, is more advantageous in controlling supersaturation, and is possible to provide a wafer with improved crystal properties.

The raw material 300 may be a raw material in the form of particles having a particle diameter ($D_{50}$) of 130 to 400 um, and the raw material in the form of particles may or may not be necked together. When applying a raw material having such a particle diameter, it is possible to manufacture a SiC ingot that provides a wafer having better crystal properties.

In the growth step, the internal space of the crucible body 210 is adjusted to a crystal growth atmosphere such that the raw material is vapor-transported and deposited to the SiC seed, and a SiC ingot grown from the SiC seed is prepared.

The growth step includes a process of adjusting the atmosphere in the internal space of the crucible assembly 200 to a crystal growth atmosphere. Specifically, a reactor (not shown) including the crucible assembly 200 and the heat insulating material 400 surrounding the crucible assembly 200 is prepared by wrapping the crucible assembly 200 with a heat insulating material 400, and the process may be performed by placing the reactor in a reaction chamber such as a quartz tube and then heating the crucible or the like by a heating means.

The reactor is located in the reaction chamber 420 to increase a temperature in the internal space of the crucible body 210 to a temperature suitable for a crystal growth atmosphere by a heating means 500. Such temperature is one of the important factors for the crystal growth atmosphere, and by controlling conditions such as pressure and gas movement, a more suitable crystal growth atmosphere is created. A heat insulating material 400 is located between the reaction chamber 420 and the reactor to facilitate the creation and control of the crystal growth atmosphere.

The heat insulating material 400 may affect the temperature gradient inside the crucible body 210 or inside the reactor in the growth atmosphere. Specifically, the heat insulating material 400 may include a graphite heat insulating material, and more specifically, the heat insulating material may include a rayon-based graphite felt or a pitch-based graphite felt.

The heat insulating material 400 may have a density of 0.14 to 0.28 g/cc. The heat insulating material 400 may have an air porosity of 72 to 90%. By using such heat insulating material 400, it is possible to suppress the shape of the ingot from growing concave or excessively convex, and to reduce polymorphic quality to be deteriorated or generating cracks in the ingot.

The crystal growth atmosphere may be created from heating by the heating means 500 outside the reaction chamber 420. It may be created under reduced pressure and/or an inert atmosphere (eg, an Ar atmosphere, an $N_2$ atmosphere, or a mixed atmosphere thereof) by simultaneously or separately reducing the pressure with the heating to remove air.

The crystal growth atmosphere allows the raw material 300 to be vapor-transported to the surface of the SiC seed 110, thereby inducing the growth of the SiC crystal to the ingot 100.

The crystal growth atmosphere may have a growth temperature of 2000 to 2500° C. and a growth pressure of 1 to 200 torr. When such temperature and pressure are applied, a SiC ingot 100 can be more efficiently manufactured.

Specifically, the crystal growth atmosphere may have the growth temperature that the upper and lower surface temperature of the crucible is 2100 to 2500° C., and the growth pressure of 1 to 50 torr. More specifically, it may have the growth temperature that the upper and lower surface temperature of the crucible is 2150 to 2450° C., and the growth pressure of 1 to 40 torr. Still more specifically, it may have the growth temperature that the upper and lower surface temperature of the crucible is 2150 to 2350° C., and the growth pressure of 1 to 30 torr.

When the crystal growth atmosphere described above is applied, it is more advantageous to manufacture a SiC ingot having higher quality.

Different SiC seeds 110 may be used depending on the characteristics of the SiC ingot 100 to be grown. For example, 4H—SiC wafer, 6H—SiC wafer, 3C—SiC wafer, 15R—SiC wafer, etc. may be used, but is not limited thereto.

Different SiC seeds 110 may be used depending on the size of the SiC ingot 100 to be grown. The diameter of the SiC ingot 100 may be 4 inches or more, specifically, 5 inches or more, more specifically 6 inches or more. Still more specifically, the diameter of the SiC ingot 100 may be 4 inches to 12 inches, 4 inches to 10 inches, or 4 inches to 8 inches.

Various SiC seeds 110 may be used as long as it is capable of growing a 4H—SiC single crystal, for example, 4H—SiC seed, whose front surface where the SiC ingot 100 grows is C plane (0001) may be used.

The raw material 300 is vapor-transported in a crystal growth atmosphere toward the SiC seed 110, and grows the SiC ingot 100 on the surface of the SiC seed 110.

The SiC ingot 100 contains 4H SiC, and may have a convex or flat surface.

If the shape of the surface of the SiC ingot 100 is unintentionally formed as concave, it may be because an unintended crystal having different polymorphism such as 6H—SiC is mixed with the intended 4H—SiC crystal, and it may cause deterioration of the quality of the SiC ingot 100. In addition, when the surface of the SiC ingot 100 is formed as excessively convex, cracks may occur in the ingot 100 itself or crystal may be broken during wafer processing.

Whether the SiC ingot 100 is formed as excessively convex is determined based on a degree of warpage, and the SiC ingot 100 prepared according to the present disclosure has the degree of warpage of 10 mm or less.

The degree of warpage is determined as follows. The sample, whose growth of the SiC ingot 100 has been completed, is placed on a surface plate, heights of a center and an edge of the ingot 100 are measured with a height gauge based on a back surface of the ingot 100, and the degree of warpage is determined by subtracting the height of the edge from the height of the center. A positive value for the degree of warpage means convexity, 0 means flatness, and a negative value for the degree of warpage means concavity.

Specifically, the SiC ingot 100 may have a surface having a convex shape or a flat shape and the degree of warpage may be 0 to 10 mm. The SiC ingot 100 having such degree of warpage is easier to be processed into wafers and may reduce occurrence of cracks. In addition, since polymorphic mixing may be controlled substantially, it is more advantageous to manufacture a SiC ingot that is substantially a single crystal.

The SiC ingot 100 may be a 4H—SiC ingot, which is substantially a single crystal whose defects and polymorphic mixing are minimized.

The SiC ingot 100 is substantially made of a 4H SiC, whose surface may be convex or flat.

The SiC ingot 100 may reduce defects that may occur in a conventional SiC ingot, thereby providing a SiC wafer having higher quality.

The SiC ingot 100 prepared according to the method of the present disclosure has a reduced number of pits on the surface, and specifically, the number of pits on the surface of the ingot 100 according to the present disclosure having a diameter of 4 inches or more is 10 k/cm$^2$ or less.

In the present disclosure, the piton the surface of SiC ingot is evaluated by measuring a number of the pit per unit area (1 m$^2$) at five spots observed with an optical microscope, and then calculating an average of the numbers. Wherein the five spots are as follows: one spot in a center of the surface of the SiC ingot except for facets, and four spots at 3, 6, 9, and 12 o'clock located approximately 10 mm from the edge of the SiC ingot toward the center.

The SiC ingot may be processed into a SiC wafer using conventional methods.

For example, an outer edge of the SiC ingot is ground using a grinding equipment for the outer edge (External Grinding), sliced into constant thickness, and subsequent processing such as an edge grinding, a surface grinding, and a polishing may be performed.

Specifically, the wafer having an off angle of 0 degrees with respect to the (0001) plane from the SiC ingot may have a locking angle of −1.0 degrees to +1.0 degrees relative to the reference angle, −0.5 degrees to +0.5 degrees relative to the reference angle, −0.1 degrees to +0.1 degrees relative to the reference angle, or −0.05 degrees to +0.05 degrees relative to the reference angle. The ingot having these characteristics has excellent crystalline properties.

The locking angle, which is related with the crystallinity of the wafer is evaluated as follows: a direction of the wafer [11-20] is aligned with a X-ray path of a high resolution X-ray diffraction analysis system (HR-XRD system); setting angles of the X-ray source optic and the X-ray detector optic to 2θ (35 to 36 degrees); the rocking curve is determined by controlling an omega (ω, or theta θ, X-ray detector optic) angle to correspond to the off angle of the wafer; and the crystallinity is evaluated from the locking angle, which is obtained from a difference between the peak angle, which is a reference angle, and two full width at half maximum (FWHM) (hereinafter, same applies to the locking angle).

In the present disclosure, an off angle of X degrees means that it has an off angle determined as X degrees within a general error range, and for example, it includes an off angle in a range of (X−0.05 degrees) to (X+0.05 degrees).

In the present disclosure, the locking angle "−1 to +1 degree relative to the reference angle" means that the full width at half maximum is in the range of (peak angle-1 degree) to (peak angle+1 degree) with respect to the peak angle, which is the reference angle.

In addition, a surface excluding a center part and a part within 5 mm from an edge to the center is divided substantially equally into three parts, and an average value of three or more measurements in each part is determined as the locking angle.

Specifically, the omega angle is 17.8111 degree when the off angle is 0 degree, the omega angle is 13.811 degree when the off angle is 4 degree, and the omega angle is 9.8111 degree when and the off angle is 8 degree. The omega angle is in the range of 9.8111 degrees to 17.8111 degrees.

Specifically, the wafer having an off angle of 4 degree with respect to the (0001) plane of the SiC ingot 100 may have locking angles of −1.5 degree to +1.5 degree relative to the reference angle, −1.0 degree to +1.0 degree relative to the reference angle, −0.5 degree to +0.5 degree relative to the reference angle, −0.1 degree to +0.1 degree relative to the reference angle, and −0.05 degree to +0.05 degree relative to the reference angle. The ingot having these characteristics has excellent crystalline properties.

Specifically, the wafer having an off angle of 8 degree with respect to the (0001) plane of the SiC ingot 100 may have locking angles of −1.0 degree to +1.0 degree relative to the reference angle, −0.5 degree to +0.5 degree relative to the reference angle, −0.1 degree to +0.1 degree relative to the reference angle, and −0.05 degree to +0.05 degree relative to the reference angle. The ingot having these characteristics has excellent crystalline properties.

The SiC ingot may be a SiC ingot with a diameter of 4 inches or more. Specifically, the SiC ingot may have a diameter of at least 4 inches, at least 5 inches, or at least 6 inches. Specifically, the SiC ingot may have a diameter of 4 inches to 12 inches, 4 inches to 10 inches or 4 inches to 8 inches.

According to the embodiment described in the present disclosure, it is possible to manufacture a SiC ingot having excellent crystal quality and less defects, as described above, with a relatively large diameter.

In a method for preparing a SiC wafer according to another embodiment, the SiC ingot, which is prepared by a method including a preparation step, a raw material loading step, and a growth step, is manufactured into a SiC wafer through a slicing step and a grinding step. The detailed descriptions for each configuration of the device and each step of the method, such as the preparation step, the raw material loading step, the growth step, the raw material, the crucible body, the crucible cover, the crucible assembly, and the SiC seed, are same as described above, and thus the detailed descriptions for these configurations and the steps are omitted in the following description.

The slicing step is a step of preparing a sliced crystal by slicing the SiC ingot to have a constant off angle. The off angle is based on the (0001) plane in 4H SiC. Specifically, the off angle may be an angle selected from 0 to 15 degree, an angle selected from 0 to 12 degree, or an angle selected from 0 to 8 degree.

The slicing may be performed by a slicing method that is conventionally used in the manufacture of wafer. For example, cutting with a diamond wire or a wire to which a diamond slurry is applied, and cutting with a blade or a wheel to which a diamond is partially applied, may be used, but is not limited thereto.

The thickness of the sliced crystal may be adjusted considering the thickness of the wafer to be manufactured, and may be sliced to an appropriate thickness considering the thickness of the wafer after ground in the grinding step described as follows.

The grinding step is a step of forming a SiC wafer by grinding the sliced crystal such that its thickness is 300 to 800 um.

In the grinding step, a grinding method, which is conventionally used in the manufacture of wafer, may be used. For example, after processes such as lapping and/or grinding or the like, polishing or the like may be performed.

The SiC wafer manufactured as above has a large diameter of 4 inches or more, contains 4H SiC, and may have an off angle of 0 degree with respect to the (0001) plane of 4H SiC and a locking angle of −1.0 to +1.0 degree relative to the reference angle. The SiC wafer has advantages of having large diameter, substantially single crystalline characteristics, fewer defects, and excellent crystalline characteristics.

The SiC ingot according to another embodiment has a large diameter of 4 inches or more, contains 4H SiC, and has a number of surface pits of 10 k/cm$^2$ or less.

The wafer having an off angle of 0 degree of the SiC ingot may include a locking angle of −1.0 to +1.0 degree relative to a reference angle. The off angle is based on the (0001) plane of 4H SiC. The SiC ingot having the above characteristics has a large area and excellent crystalline quality.

A device for preparing a SiC ingot according to another embodiment includes a reactor and a reaction chamber 420.

A crucible assembly 200 including a crucible body 210 having an internal space is disposed in the reactor, and a raw material 300 is loaded in the crucible assembly 200 and SiC seeds 110 are disposed at regular intervals spaced apart from the raw material 300.

The crucible assembly 200 may include a crucible body 210 and a crucible cover 220 covering the crucible body 210.

The crucible assembly 200 may be wrapped with a heat insulating material 400 and placed in the reactor, as described above.

The reactor is located inside the reaction chamber 420, and the crucible body 200 or its internal space is heated to a temperature suitable for a crystal growth atmosphere by a heating means. Along with the temperature control, conditions such as pressure of the internal space and gas movement are adjusted to create a more suitable crystal growth atmosphere.

In the internal space of the crucible body 210, a crystal growth atmosphere is created such that the raw material 300 is vapor-transported and deposited on the growth surface of the SiC seed 110, and SiC crystals grow on the growth surface.

In the device, features of the crucible body 210, the crucible cover 220, and the like are same as described above, and thus description thereof is omitted.

In the device, descriptions for the SiC ingot, the SiC wafer, and the like are same as described above, and thus description thereof is omitted.

Hereinafter, while embodiments of the present disclosure will be described in more detail with reference to the accompanying examples, it should be noted that examples are not limited to the following.

Preparation of the SiC Ingot

Figure 2:
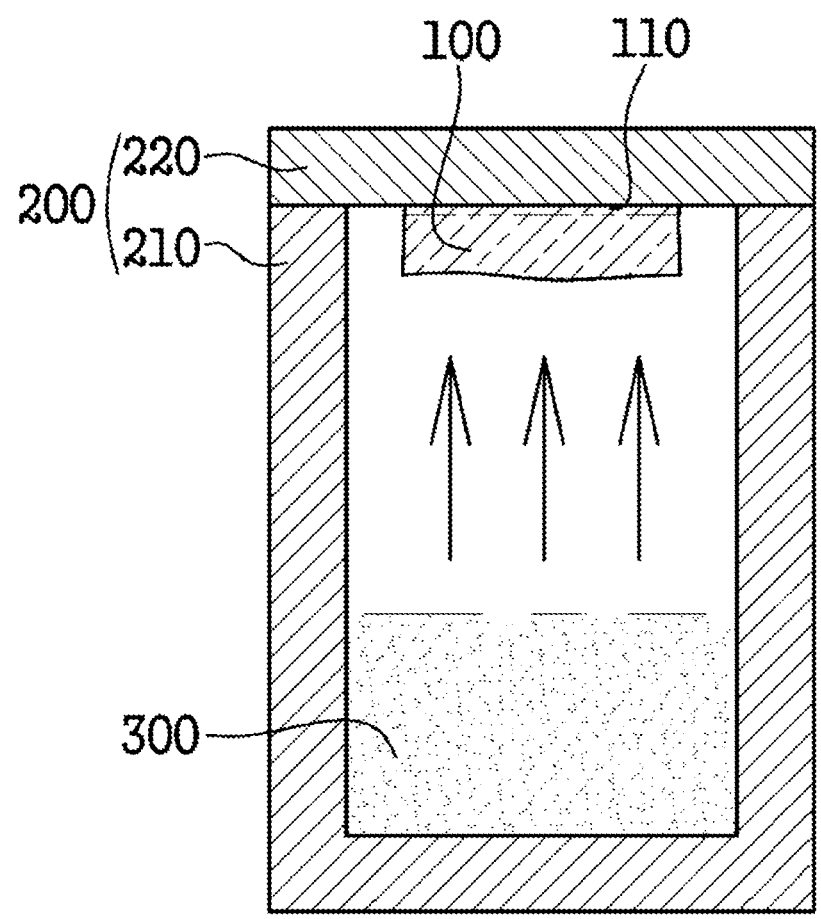
FIG. 2 is a conceptual view illustrating a cross section of a crucible assembly according to one embodiment.
Figure 3:
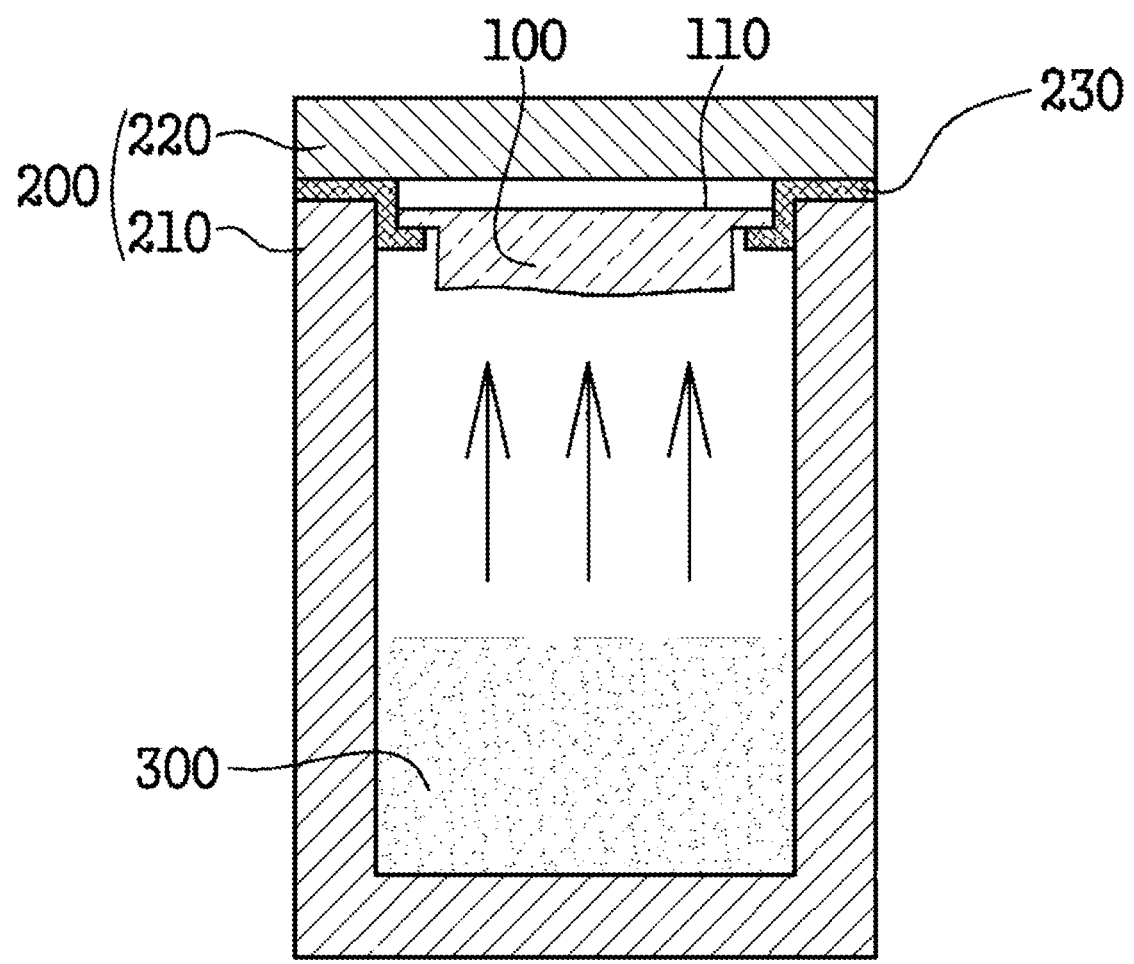
FIG. 3 is a conceptual view illustrating a cross section of a crucible assembly according to another embodiment.

A crucible assembly having the structure shown in FIG. 2 was used to prepare the SiC ingot. The SiC particles, which are raw materials, were loaded into the internal space of the crucible body, and the SiC seeds were disposed over the raw materials. The C plane (000-1 plane) of the SiC seed (4H—SiC crystal, 6 inch) was fixed to face the bottom of crucible. The same applies to the following examples and comparative examples.

The crucibles having the density and the resistance as shown in Table 1 below were used. The density and resistance of each crucibles were measured before ingot growth using the crucibles. The resistance was measured using an LCR meter and coil.

A Litz coil with a diameter of 0.1 mm arranged with 750 strands of leading wires based on the cross section, is wound 27 turns on the side of the crucible body to manufacture a cylindrical leading wire portion, and the Litz coil was connected to the LCR meter. The leading wire portion had the outer diameter of 224 mm, the inner diameter of 211 mm, and the height of 185 mm. The electromagnetic property was measured by applying AC power to the LCR meter, and Ls was measured as 131 uH and Rs was measured as 1.03Ω. The electromagnetic property values measured at each crucible body were converted into DC resistance and shown in Table 1 below.

As the raw material, SiC particles (the entire SiC particles were 100%) were applied in the same manner.

Each of the crucible assembly was equipped with the same heat insulating material, and placed in a reaction chamber equipped with a heating coil as a heating means.

The internal space of the crucible assembly was depressurized to create a vacuum atmosphere, and argon gas was injected to the internal space of the crucible assembly to reach atmospheric pressure, and then the internal space of the crucible assembly was slowly depressurized again. At the same time, the temperature of the internal space of the crucible assembly was gradually raised to 2300° C. SiC ingot was grown for 100 hours under a temperature of 2300° C. and a pressure of 20 torr.

A wafer was manufactured from the ingot, and properties of the wafer and the ingot were evaluated. The properties were evaluated by measuring the locking angle and the like, and the specific method for evaluation will be described as follows.

An Evaluation on the Properties of SiC Ingots (1) Evaluation for Deviation of Center Edge of Ingot (Warpage):

The sample whose growth of SiC ingot had been completed was placed on a surface plate. Heights of a center and an edge of the ingot were measured with a height gauge based on a back surface of the ingot, and the warpage was evaluated by subtracting the height of the edge from the height of the center. A positive value of warpage means convexity, a value of 0 means flatness, and a negative value means concavity.

(2) Evaluation of Locking Angle:

Using a high resolution X-ray diffraction analysis system (HR-XRD system, Rigaku's SmartLab High Resolution X-ray Diffraction System), a wafer with an off-angle of 0 degree based on a 4H SiC (0001) plane, was prepared from the ingot, After setting [11-20] direction of the wafer to the X-ray path and setting X-ray source optic and X-ray detector optic angles to 2θ (35 to 36 degrees), a locking angle was measured by adjusting an omega (ω, or theta θ, X-ray detector optic) angle to the off angle of the wafer. Specifically, the omega angle was 17.8111 degree based on 0 degree off, the omega angle was 13.811 degree based on 4 degree off, and the omega angle was 9.8111 degree based on 8 degree off. X-ray power was 9 kW, X-ray target was Cu, and Goniometer resolution was 0.0001 degree. The FWHM was measured based on the angle at Max Intensity and evaluated as a rocking angle, respectively, and the results are shown in Table 1 below.

The surface of the wafer excluding a center portion and an edge within 5 mm from the center portion was divided into three parts. The following results are shown by averaging the results obtained by measuring at least three times for each part.

TABLE 1

| | Crucible density [g/cm$^3$] | Electric resistance of Crucible body [Ω] | Center-Edge deviation of Ingot T [mm] | locking angle: 0 degree | locking angle: 4 degree | locking angle: 8 degree |
|---|---|---|---|---|---|---|
| Example 1 | 1.7 | 3.45 | 2.9 | 17.811° ± 0.05° | — | — |
| Example 2 | 1.72 | 3.37 | 4.3 | — | 13.811° ± 0.12° | — |
| Example 3 | 1.84 | 3.2 | 3.4 | 17.811° ± 0.08° | — | — |
| Example 4 | 1.85 | 3.08 | 3.9 | — | 13.811° ± 0.09° | — |
| Example 5 | 1.86 | 3.09 | 5.3 | — | — | 9.811° ± 0.15° |
| comparative example 1 | 1.9 | 4.21 | −1.1 | 17.811° ± 2.5° | — | — |
| comparative example 2 | 1.70 | 2.89 | 10.5 | 17.811° ± 2.1° | — | — |

Referring to Table 1, it was confirmed that the graphite crucible having a density of 1.72 to 1.92 g/cm$^3$ exhibited better properties in terms of center-edge deviation and locking angle compared to the graphite crucible having a density of less than 1.72 g/cm$^3$ or more than 1.93 g/cm$^3$.

In particular, the center-edge deviation of the ingot of comparative example 2 having the density of 1.70 g/cm$^3$ was 10.5 mm, and the center-edge deviation of the ingot of comparative example 1 having the density of 1.9 g/cm$^3$ was −1.1 mm. Therefore, it was confirmed that there is a high possibility that polymorphic mixing or cracks may occur in the wafer processing process due to stress.

The electrical resistance of the crucible body is an element that can influence the degree of heat generation during heating. Examples 1 to 5 having an electrical resistance value of 2.9Ω or more showed excellent properties compared to comparative example 2. However, the crucible body of comparative example 1 having a high resistance of 4.21Ω showed somewhat inferior properties of the manufactured ingot and wafer, such as a concave ingot. However, the density of the crucible body was not proportional to the electrical resistance thereof.

In Examples 1 to 4, the warpage properties of the ingot (center-edge deviation) was also good, and the locking angle characteristics of the wafers produced therefrom were also excellent. Therefore, it was confirmed that the properties of the ingot and the wafer produced therefrom can be improved by controlling characteristics of the crucible.

The method for preparing a SiC ingot, the method for preparing a SiC wafer and the device for preparing a SiC ingot presented in the examples described herein may enable controlling of characteristics of the crucible, thereby enables more precise control of a degree of supersaturation of the gas vapor, which is transported in the ingot growth process. The methods and the device disclosed in the above description provide a method and a device for preparing a SiC ingot, which can produce SiC ingots with better properties, and SiC ingots and wafers made therefrom.

While specific examples have been shown and described above, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method for preparing a SiC wafer, comprising:
preparing a crucible assembly comprising a crucible body having an internal space;
loading a raw material into the internal space of the crucible body and placing a plurality of SiC seeds in the internal space of the crucible body at regular intervals spaced apart from the raw material;
growing a SiC ingot from the plurality of SiC seeds by adjusting the internal space of the crucible body to a crystal growth atmosphere such that the raw material is vapor-transported and deposited to the plurality of SiC seeds; and
forming the SiC wafer from the SiC ingot;
wherein a density of the crucible body is 1.70 to 1.92 g/cm$^2$,
wherein the crystal growth atmosphere is created by a heating caused by an electrical resistance of the crucible body when an electricity is applied to the crucible body, and
wherein the electrical resistance of the crucible body is 2.9 to 4.1Ω,
wherein a height deviation of the SiC ingot between a center and an edge of the SiC ingot is 0 to 10 mm,
wherein the crucible body includes a graphite,
wherein the forming the SiC wafer comprises slicing the SiC ingot to prepare a sliced crystal having an off angle of 0 to 15 degrees relative to a (0001) plane; and
grinding the sliced crystal to form the SiC wafer, and
wherein the SiC wafer having an off angle of 0 degrees with respect to the (0001) plane from the SiC ingot has a locking angle of −1.0 degrees to +1.0 degrees relative to a reference angle.

2. The method of claim 1, wherein a diameter of the SiC wafer is 4 inches or more.

3. The method of claim 1, further comprising polishing the ground sliced crystal.

* * * * *